(12) United States Patent
Santurkar et al.

(10) Patent No.: US 6,298,007 B1
(45) Date of Patent: Oct. 2, 2001

(54) METHOD AND APPARATUS FOR ELIMINATING FALSE DATA IN A PAGE MODE MEMORY DEVICE

(75) Inventors: Vikram S. Santurkar, San Jose, CA (US); Yasushi Kasa, Kawasaki (JP)

(73) Assignees: Advanced Micro Device, Inc., Sunnyvale, CA (US); Fujitsu Limited, Kanagawa (JP)

(*) Notice: Subject to any disclaimer, the term of this patent is extended or adjusted under 35 U.S.C. 154(b) by 0 days.

(21) Appl. No.: 09/652,742

(22) Filed: Aug. 31, 2000

Related U.S. Application Data

(60) Provisional application No. 60/189,566, filed on Mar. 15, 2000.

(51) Int. Cl.[7] .................................................... G11C 8/00
(52) U.S. Cl. ...................... 365/238.5; 365/194; 365/200
(58) Field of Search ............................. 365/238.5, 233.5, 365/230.08, 230.06, 230.02, 230.01, 194, 200

(56) References Cited

U.S. PATENT DOCUMENTS

| | | | | |
|---|---|---|---|---|
| 5,289,413 | * | 2/1994 | Tsuchida et al. | 365/189.02 |
| 5,757,703 | * | 5/1998 | Merritt et al. | 365/189.05 |
| 6,111,814 | * | 8/2000 | Schaefer | 365/233.5 |

* cited by examiner

*Primary Examiner*—David Nelms
*Assistant Examiner*—Thong Le

(57) ABSTRACT

A flash memory (100) includes a core cell array (104), address decoders (116), one or more output buffers (110) and sensing circuitry including sense amplifiers which sense data at an address selected by the address decoders. A data switching multiplexer (108) is coupled to the output buffers to select a sense amplifier for a current word of data in response to a control signal (RWDEN). A control circuit (106) is coupled to the data switching multiplexer to provide the control signal at a time to ensure the current word of data is provided to the output buffers.

15 Claims, 2 Drawing Sheets

METHOD AND APPARATUS FOR ELIMINATING FALSE DATA IN A PAGE MODE MEMORY DEVICE

This apply claims benefit of provisional No. 60/189,566 filed Mar. 15, 2000.

BACKGROUND OF THE INVENTION

The present invention relates generally to memory devices. More particularly, the present invention relates to a method and apparatus for eliminating false data in a page mode memory device.

Design goals for memory devices such as semiconductor memories include high speed, low read time and write time, large capacity, minimized power dissipation and minimal cost. Satisfaction of these goals typically requires trade-off. For example, a low read time and write time are harder to achieve in a large capacity memory because of internal capacitances and current drive limitations of the transistors used in the memory.

Semiconductor memory devices have been developed in a variety of technologies to provide particular features for a user. Generally, semiconductor memories may be classified as volatile and nonvolatile. Volatile memories do not retain stored data when operating power is removed. Examples are random access memory (RAM). Nonvolatile memories do retain stored data even when power is removed. Examples include electrically programmable read only memory (EPROM) and flash memory. Nonvolatile memories store charge on an insulated floating gate of a core cell to change the threshold voltage of an associated transistor. The threshold voltage is indicative of the data stored in the core cell.

In addition to memory technology, memory architectures have been developed to enhance memory performance. One example of a memory architecture is a page mode memory. In a page mode memory operated in page mode, a plurality of words on a common page are sensed at one time. By changing a word address applied to the memory, different words of data may be provided at the output. The sensing and output time is relatively long, for example, 115 ns. However, once the data have been sensed and the first word provided at the output, providing subsequent words from the page takes much less time, such as 25 ns. Thus, page mode memories allow multiple words to be read at a higher average access time.

To reduce the manufacturing cost of a memory, it is known to include redundant elements such as core cells and sense amplifiers, which detect the state of associated core cells. During testing of the memory, faulty core cells and sense amplifiers are detected and replaced with redundant elements. Use of redundant elements improves the overall manufacturing yield and therefore reduces the manufacturing cost for each memory.

Some page mode memories employing redundant elements have exhibited a false data problem. After an initial page mode access is made, the data is sensed from core cells of the memory, then latched and sent to the output buffers and input/output pads of the memory. The data is latched so that subsequent word accesses need only select the latched word data, rather than having to access the core cells where the data is stored. Subsequent word accesses occur by asserting a word address and generating word decode signals to select the proper latched data. If the word decode signals occur before the latch containing the data is set, then the data in process of being modified in the latch will propagate to the output. That is old data will propagate to the output rather than the newly sensed data.

This false data propagation causes several problems. First, the incorrect or false data may be inadvertently detected by the circuit which is accessing the memory, creating an error in subsequent processing. Second, to reduce such errors may require slowing down the operation of the memory. Specifically, the page mode read access time may be increased. In one implementation, it has been observed that the problem occurs mainly in two cases. First, the problem occurs when switching between redundant blocks, which causes the word decode signals of the previous block to give false data for the new block. Second, the problem occurs when inside a redundancy block while switching between a regular element to a redundant element.

Since these problems are undesirable, there is a need for a method and apparatus for eliminating false data in a page mode memory device.

BRIEF SUMMARY OF THE INVENTION

By way of introduction only, a method and apparatus in accordance with the present invention uses address transition detection to delay word decode signals. The address transition signals are delayed to produce a control signal. The control signal controls the flow of data from the regular or redundant sense amplifiers to the output buffers. This control signal allows the correct data to reach the memory outputs and prevents any false data transitions.

The foregoing discussion of the preferred embodiments has been provided only by way of introduction. Nothing in this section should be taken as a limitation of the following claims, which define the scope of the invention.

DETAILED DESCRIPTION OF THE PRESENTLY PREFERRED EMBODIMENTS

Figure 1:
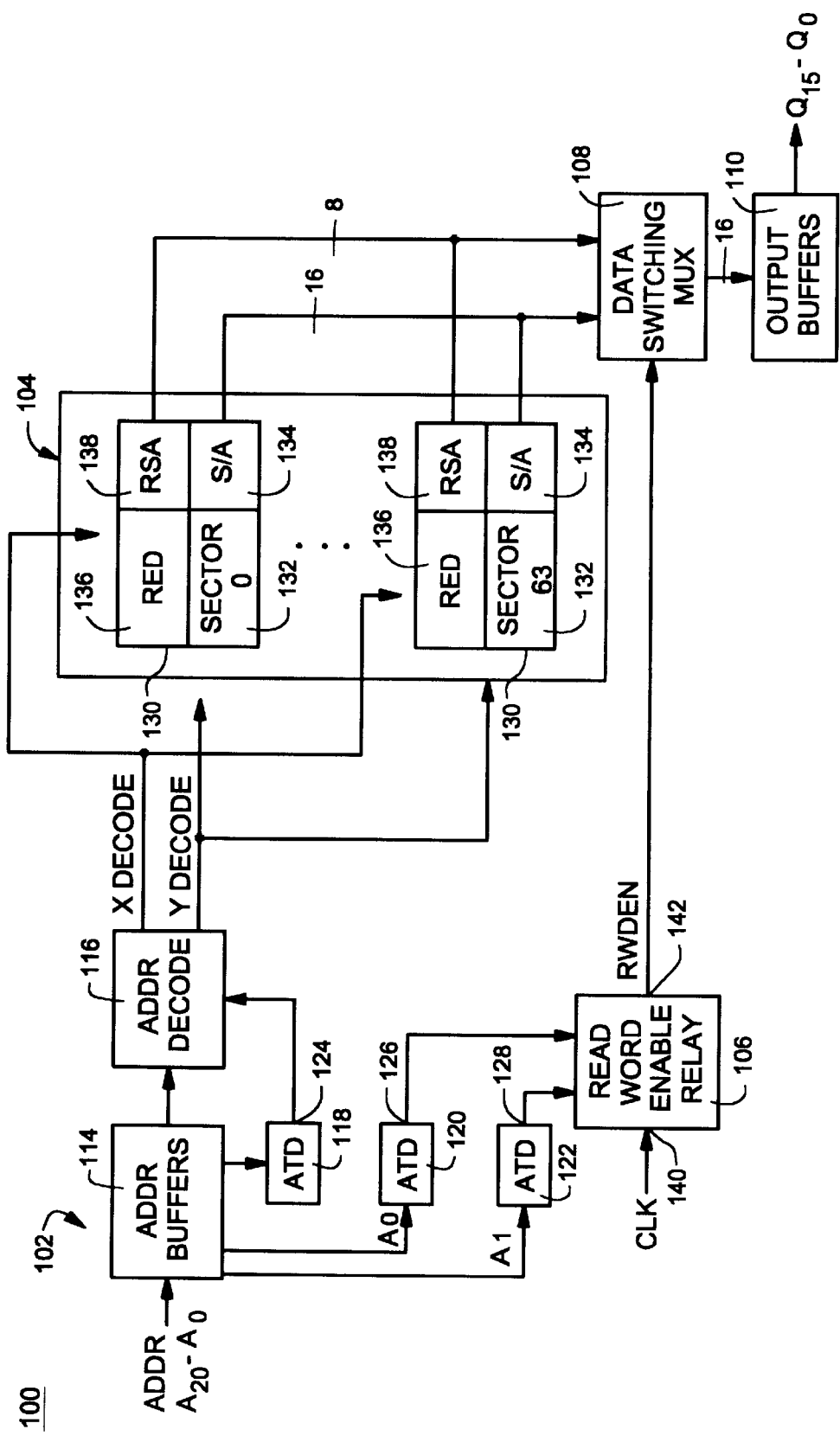
FIG. 1 is a block diagram of a page mode memory.

Referring now to the drawing, FIG. 1 is a block diagram of a memory 100 operable in page mode. The memory 100 includes address decoding circuitry 102, a core cell array 104, a read word enable delay circuit 106, a data switching multiplexer 108 and output buffers 110. It is to be understood that the memory 100 includes other circuitry, such as a state machine for controlling operation of the memory 100, data input circuits for programming the memory, and charging circuits for generating necessary on-chip voltages for reading and writing data in the memory 100. These elements are not shown in FIG. 1 so as to not unduly complicate the drawing figure.

Preferably, the memory 100 is embodied as a monolithic integrated circuit. In the illustrated embodiment, the memory 100 is a flash memory operable in page mode. That is, a page of four sixteen-bit words is sensed simultaneously. One word at a time is presented to the output buffers 110 for provision to external circuitry. Thus, sixty four bits of data are sensed and latched in response to a page address received by the address decoding circuitry 102. The page address in the illustrated embodiment is defined by address signals A20-A2. Individual sixteen bit words are selected for output by varying a two bit word address. In the illustrated embodiment, the word address is defined by the two least significant address bits, A1 and A0.

The address decoding circuitry 102 includes address buffers 114, address decoders 116, address transition detection circuit 118, address transition detection circuit 120 and address transition detection circuit 122. The address buffers 114 are configured to receive an address signal from external to the memory 100. The address signal is preferably a multiple-bit digital signal and in the illustrated embodiment is 20 bits in size, A20-A0. Other bit sizes may be used. The address signal is related to the size of the core cell array 104. There are preferably 20 address buffers 114 for receiving the 20 bits of the address signal. The address buffers receive the address signal and generate internal address signals.

The address decoders 116 receive the internal address signals and decode a unique address within the core cell array 104. The unique address in the illustrated embodiment is a sixty four bit page of data containing four sixteen bit words of data stored in the core cell array. The address decoders are generally grouped as an X decoder and a Y decoder. The X decoder selects one or more rows within the core cell array and the Y decoder selects one or more columns within the core cell array. When a row is selected, a word line for the row is driven to a relatively high voltage causing core cells along that row to turn on. The current conducted in each core cell is related to the data stored in each core cell. A first current will be conducted if a logic 1 is stored in the core cell. A second current will be conducted if a logic 0 is stored in the core cell.

The address transition detection circuits 118, 120, 122 sense a transition of one of the input address signals and produce an address transition detection signal. The address transition detection circuit 118 detects a transition of any of the bits of the input address signal and produces the address transition detection signal at an output 124. The address transition detection signal at the output 124 is provided to the address decoders 116 and used for gating, timing and other purposes. The address transition detection circuit 120 detects a transition on the least significant address bit Av. And produces an address transition detection signal at an output 126. In a similar manner, address transition detection circuit 122 detects a transition on address bit Ac and produces an address transition detection signal at an output 128. These address transition detection signals are provided to the read word enable delay circuit 106.

In alternative embodiments, the address transition detection circuits 118, 120, 122 may be combined in a single address transition detection circuit or otherwise partitioned to provide the necessary function. It may be preferable to combine these circuits in this manner in order to reduce the surface area on the integrated circuit embodying the memory 100 or to reduce the overall power consumption of the memory 100.

The core cell array 104 is preferably partitioned into a plurality of sectors 130. Each sector 130 is generally identical and includes an array of regular core cells 132 and associated sense amplifiers 134. In addition, to provide redundancy, each sector 130 includes redundant core cells 136 and redundant sense amplifiers 138. The redundant elements are preferably identical to the regular elements and may be switched in place of a regular element. The redundant elements will preferably function identically and transparently in place of a regular element when a regular element is faulty. The process of manufacturing the memory 100 includes testing all storage locations of the memory 100 to identify faulty storage locations and programming the memory to switch in redundant core cells 136 and sense amplifiers 138 in place of the faulty elements. For example, content addressable memory cells including nonvolatile storage elements may be programmed to permanently switch the redundant elements into the circuit.

The sense amplifiers 134 and the redundant sense amplifiers 138 detect the state of the data stored in the core cells 132 and the redundant core cells 136 selected by the address decoders 116. For example, the sense amplifiers 134, 138 detect the relative magnitude of the current in the selected core cells and make a determination of the stored data state in response thereto. In the illustrated embodiment, the sense amplifiers include a data storage element such as a latch. After sensing, the data is latched for subsequent selection by a word address defined by the address bits A1 and A0.

In the illustrated embodiment, the core cell array 104 includes sixty four sectors 130 labelled sector through sector 63. Each sector stores one bit of the sixty four bits sensed during page mode. Other architectures may be substituted and the core cell array 104 may be partitioned in any suitable manner. The illustrated architecture is exemplary only.

The read word enable delay circuit 106 receives the address transition detection signals from the address transition detection circuits 120, 122. The delay circuit 106 operates to delay the transition detection signals by a predetermined amount to ensure that the current word of data is provided from the sense amplifiers 134, 138 to the output buffers 110, as will be described in further detail below in conjunction with FIG. 2. The delay circuit 106 may implement the delay in any suitable fashion. In one example, the delay is produced by including one or more delay latches clocked by a clock signal received at an input 140. In another, an analog delay circuit is implemented using passive components such as resistors and capacitors. In still another example, an external timing circuit may be provided by the state machine (not shown) which controls operation of the memory 100. Any of these embodiments and their equivalents form delay means for delaying the address transition detection signal to produce a control signal. The delay circuit 106 produces a read word enable signal RWDEN at an output 142. The delay circuit 106 thus forms a control means for generating a control signal in response to the address decoding means formed by the address decoding circuit 102.

The data switching multiplexer 108 receives sensed data from the sense amplifiers 134 and from the redundant sense amplifiers 138. The multiplexer also receives the control signal RWDEN from the delay circuit 106. The control signal RWDEN controls the flow of data from the regular or redundant sense amplifiers to the output buffers 110. This signal allows the correct data to reach the output buffers and prevents any false data transitions. The multiplexer 108 may be implemented using any suitable combinatorial or clocked logic.

The output buffers 110 detect the data received from the multiplexer 108 and buffer the data for driving signals off chip from the memory 100. In the illustrated embodiment of a page mode memory supplying sixteen bit words of data, there are a total sixteen output buffer circuits. Each output buffer circuit provides one bit of output data Q15-Q0.

Figure 2:
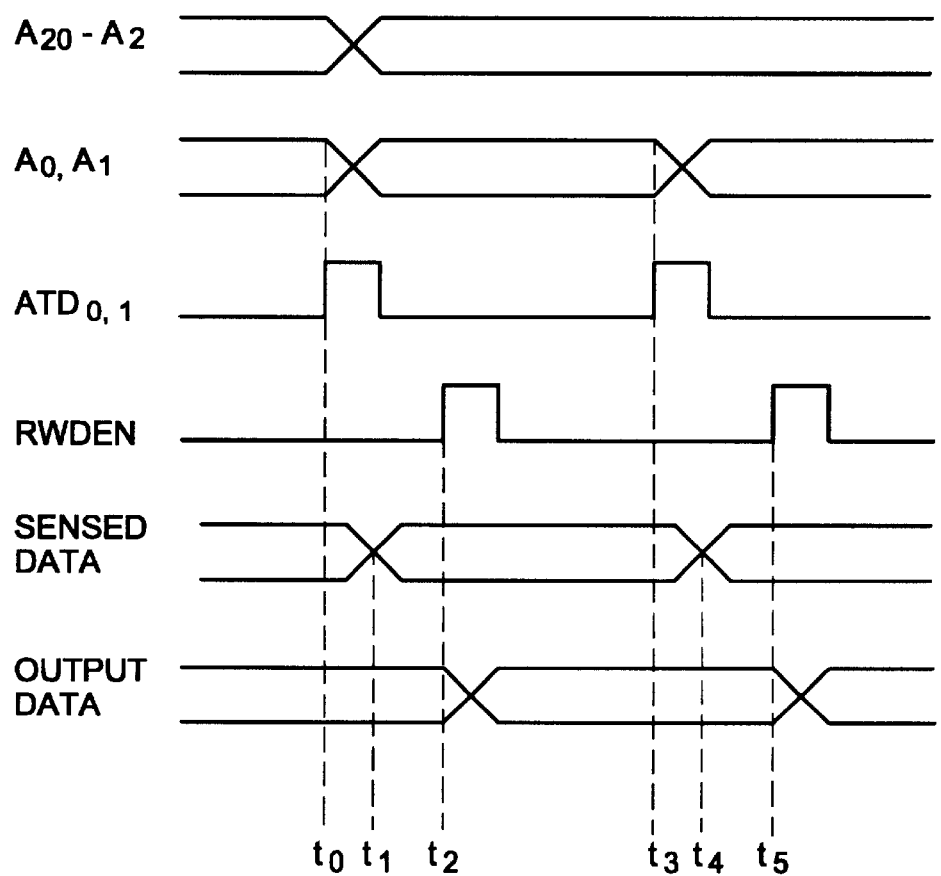
FIG. 2 is a timing diagram illustrating operation of the page mode memory of FIG. 1.

FIG. 2 is a timing diagram illustrating operation of the memory 100 of FIG. 1. The timing diagram illustrates transitions of the page address A20-A2.; the word address A1, A0.; address transition detection signal ATD0, 1; control signal RWDEN; sensed data at the inputs to the data switching multiplexer 108; and the output data produced by the output buffers 110 at the chip outputs Q15-Q0.

At an initial time t0, the page address A20-A2. And the word address A1-A0. are changed to perform a page mode access of the memory. In response to the changed address received at the address buffers 114, the address decoders 116 select a unique X address and a unique Y address in the core cell array 104 corresponding to the input address. Also in response to the changed address, the address transition detection circuits 120, 122 generate an address transition signal at the outputs 126, 128. The signal at the output 126 is labelled ATD0 in FIG. 2 and the signal at the output 128 is labelled ATD1. The address transition detection signal preferably has the form of a positive-going pulse of predetermined time duration. However, any suitable signal format may be used.

At time t1, the sensed data changes state. This corresponds to the output of the sense amplifiers 134 and redundant sense amplifiers 138. This may be the output signal produced by the latches which hold the sixty four bit page of data.

At time t2, the control signal RWDEN is activated. The control signal RWDEN is produced by the read word enable delay circuit 106 in response to the address transition detection signals ATD0, 1 and may simply be a delayed version of those signals. In other embodiments, the polarity of the control signal RWDEN may be inverted relative to the address transition detection signals ATD0,1 or the duration of the control signal RWDEN may be longer or shorter than the predetermined duration of the address transition detection signals ATD0,1. The control signal RWDEN is produced at the output 142 of the read word enable delay circuit 106 and provided to the data switching multiplexer 108.

In response to the control signal RWDEN at time t2, the data switching multiplexer 108 passes the sensed data from the sense amplifiers 134, 138 to the output buffers 110. In response, the output buffers 110 drive the chip outputs Q15-Q0 to appropriate logic levels. Thus, the delay introduced by the read word enable delay circuit 106 is equal to the difference between time t2 and time t0.

A word access begins at time t3, when the word address A1, A0. is changed to select another word on the page. The page address Ad-A.D. remains unchanged. In response to the change in the word address, the address transition detection signal ATD0, 1 has a positive going pulse of predetermined duration. Also in response to the change in the word address, the sensed data changes at time t4 to correspond to the newly selected word on the page. The address transition detection signal pulse is delayed in the read word enable delay circuit 106 by a time equal to time t5 minus time t3. At time t5, the data switching multiplexer 108 is gated by the control signal RWDEN produced by the read word enable delay circuit 106 and the outputs Q15-Q0 change to reflect the newly selected word.

From the foregoing, it can be seen that the present invention provides a new and improved method and apparatus for controlling output of data from a flash memory. A control signal is generated in response to a change in the word address to control the flow of data from the regular and redundant sense amplifiers to the output buffers. This signal ensures that the correct data reaches the outputs and prevents any false data transitions.

While one embodiment of the invention has been shown and described, variations are possible. For example, while the invention has been described in relation to a dual bank, page mode memory integrated circuit, the inventive concepts and details may be applied to other types of integrated circuits as well. It is therefore intended in the appended claims to cover all such modifications falling within the true spirit and scope of the claims.

What is claimed is:

1. A memory circuit comprising a core cell; a sense amplifier coupled to said core cell; a redundant core cell; a redundant sense amplifier coupled to said redundant core cell; an output buffer coupled to said sense amplifier and said redundant core cell; an address transition detector producing a signal in response to an input address signal bit; and a delay circuit coupled to said address transition detector thereby producing a delayed control signal; wherein sensed data from said sense amplifier and said redundant sense amplifier are passed to said output buffer in response to said delayed control signal.

2. The memory circuit according to claim 1, further comprising a multiplexer coupled between said sense amplifier and said output buffer and between said redundant sense amplifier and said output buffer, said multiplexer being responsive to said delayed control signal thereby passing said sensed data to said output buffer.

3. The memory circuit according to claim 2, in combination with a flash memory device.

4. The memory circuit according to claim 2, further comprising a latch coupled between said sense amplifier and said multiplexer and a latch coupled between said redundant sense amplifier and said multiplexer.

5. The memory circuit according to claim 1, further comprising a plurality of sectors having a multitude of memory cells; at least one of said core cell, sense amplifier, redundant core cell, and redundant sense amplifier being associated with each sector; said multiplexer receiving data from each of said plurality of sectors as a page of data; and said multiplexer passing a portion of said page to said output buffer in response to said input address signal bit.

6. The memory circuit according to claim 5, wherein said plurality of sectors is sixty-four and wherein said output buffer outputs data words of sixteen bits, each page of data thereby comprising four data words.

7. The memory circuit according to claim 6, in combination with a flash memory device; and further comprising a latch coupled between said sense amplifier and said multiplexer and a latch coupled between said redundant sense amplifier and said multiplexer.

8. A memory circuit comprising means for storing data; means for sensing said storage means; means for detecting faulty data storage means and replacing said storage means with redundant storage means; means for sensing said redundant storage means; means for outputting said sensed storage means and said redundant storage means; means for receiving an address signal; and means for delaying said means for outputting after a transition in said address signal thereby allowing correct data to be output and preventing faulty data from being output.

9. The memory circuit according to claim 8, in combination with a flash memory device.

10. The memory circuit according to claim 8, further comprising means for operating said memory circuit in page mode.

11. The memory circuit according to claim 10, wherein said means for delaying comprises a multiplexer and a delayed control signal, said multiplexer being responsive to said delayed control signal to pass said sensed storage means and said sensed redundant storage means.

12. The memory circuit according to claim 11, in combination with a flash memory device.

13. A method for outputting data from a memory circuit in a page mode comprising receiving an input address signal; detecting a transition in said input address signal; generating a delayed control signal in response to said transition detection; sensing a core cell; sensing a redundant core cell; and passing data from said sensed core cell and said redundant core cell in response to said delayed control signal thereby perventing old data from being output.

14. The method according to claim 13, wherein said delayed control signal introduces a predetermined delay into said transition detection.

15. The method according to claim 14, in combination with a flash memory device.

* * * * *